(12) United States Patent
Hase

(10) Patent No.: US 6,903,387 B2
(45) Date of Patent: Jun. 7, 2005

(54) SEMICONDUCTOR DEVICE

(75) Inventor: Ichiro Hase, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/742,751

(22) Filed: Dec. 23, 2003

(65) Prior Publication Data
US 2004/0227155 A1 Nov. 18, 2004

(30) Foreign Application Priority Data
Dec. 26, 2002 (JP) .................................... P2002-376488

(51) Int. Cl.$^7$ ............................................ H01L 29/737
(52) U.S. Cl. .................................. 257/197; 257/198
(58) Field of Search ................................. 257/197–198

(56) References Cited

U.S. PATENT DOCUMENTS 5,349,201 A * 9/1994 Stanchina et al. ............ 257/18
6,498,050 B2 * 12/2002 Fujimoto ..................... 438/48
6,822,274 B2 * 11/2004 Yi et al. ..................... 257/189

FOREIGN PATENT DOCUMENTS

| JP | 03038835 A * | 2/1991 | ......... H01L/21/331 |
|----|--------------|--------|----------------------|
| JP | 05-041388    | 2/1993 | |
| JP | 06-260493    | 9/1994 | |
| JP | 06-326120    | 11/1994 | |
| JP | 08-250509    | 9/1996 | |
| JP | 11-176838    | 7/1999 | |
| JP | 2002-270616  | 9/2002 | |
| JP | 2002-270817  | 9/2002 | |

* cited by examiner

Primary Examiner—Allan R. Wilson
(74) Attorney, Agent, or Firm—Rader, Fishman & Grauer, PLLC; Ronald P. Kanane

(57) ABSTRACT

A semiconductor device having a heterojunction bipolar transistor capable of suppressing the deterioration of basic transistor characteristics, such as a decline of an injection efficiency from an emitter layer to a base layer due to the rising of emitter resistance, a decline of breakdown strength between the base layer and a collector layer, or a decline of reliability due to an introduction of a defect; configured to comprise a heterojunction bipolar transistor having an emitter layer, base layer and a collector layer, wherein an electron affinity of the base layer is smaller than that of the emitter layer and that of the collector layer, an interlayer is formed at least either between the emitter layer and the base layer or between the base layer and the collector layer, and the electron affinity of the interlayer has a value between the electron affinities of the two layers sandwiching the interlayer.

4 Claims, 8 Drawing Sheets

3: COLLECTOR LAYER
4: BASE LAYER
5: EMITTER LAYER
11: BASE EMITTER INTERLAYER

3: COLLECTOR LAYER
4: BASE LAYER
5: EMITTER LAYER
11: BASE EMITTER INTERLAYER

12: BASE COLLECTOR INTERLAYER

SEMICONDUCTOR DEVICE

BACKGROUND OF THE INVENTION

1. Field of the Invention

The present invention relates to a semiconductor device and particularly relates to a semiconductor device having a heterojunction bipolar transistor.

2. Description of the Related Art

Transistors used for a semiconductor device are roughly divided into bipolar transistors and field effect transistors, such as MOS (metal—an oxide film—a semiconductor) field effect transistors.

A heterojunction bipolar transistor (hereinafter, also referred to as an HBT) as one of the bipolar transistors is a bipolar transistor wherein a material having a wider band gap than that of a base layer is used for an emitter layer, by which the injection efficiency (emitter efficiency) of electrons from the emitter layer to the base layer can be kept high even when the impurity density of the base layer is made higher than that of the emitter layer.

Accordingly, even when a base layer thickness is reduced, resistance of the base layer can be maintained low and punch-through of the base layer is suppressed so as to maintain breakdown strength between the emitter and the collector high. Basically, it is a device having the excellent properties of high speed and high breakdown strength.

Also, since the HBT has a high current drive ability, it is excellent as a current amplifier (power amplifier: hereinafter, it is also referred to as a PA) device. Furthermore, due to the advantage of an easy, single, power source operation, it has come to be widely used as a mobile communication terminal PA in recent years.

The Power-Added Efficiency (PAE) is known as an index indicating the efficiency of a PA. The PAE is defined as the ratio of an added power, that is the difference between an output power $P_{out}$ and an input power $P_{in}$, to a direct-current power application $P_{dc}$. The larger the value, the more the power consumption of a power amplifier can be suppressed, so that the value is used as one of the important indexes in a power amplifier. It is particularly important in a mobile communication terminal because the power consumption by a transmission side power amplifier occupies a large ratio in the whole power consumption.

In the above HBT, as an HBT being lattice matched with the InP, for example, the configuration of successively stacking on a substrate a collector layer made by n-type InGaAs, a base layer made by p-type InGaAs and an emitter layer made by n-type InP (also called an HBT of the first generation) is known.

The HBT of the first generation is capable of being driven at a very high speed but has a defect that the breakdown strength between a base and a collector is weak due to a narrow band gap of the collector layer.

On the other hand, the configuration of a double hetero structure of, for example, successively stacking on a substrate a collector layer made by n-type InP, a base layer made by p-type InGaAs and an emitter layer made by n-type InP (also called an HBT of the second generation) is known.

The HBT of the second generation has the configuration that the collector layer has a wide gap compared with the case of the HBT of the first generation, so that the breakdown strength can be improved.

However, since the electron affinity of the collector layer is smaller than that of the base layer, a current flow from the base layer to the collector layer is hindered, so that it is necessary to make the energy band profile between the base and the collector graded, etc. for improvement.

In the case of configuring a power amplifier by using an HBT as the above, one of demands to the device side to improve the PAE is a reduction of a knee voltage $V_k$ in the $I_c$-$V_{ce}$ characteristic.

To reduce the knee voltage, an offset voltage $V_{offset}$ as a rising voltage of the $I_c$ in the $I_c$-$V_{ce}$ characteristic has to be made small.

The above offset voltage $V_{offset}$ is almost determined by the difference of a rising voltage $V_{teb}$ in the forward direction between the emitter and the base and a rising voltage $V_{tbc}$ in the forward direction between the base and the collector, that is $V_{teb}$-$V_{tbc}$.

In a heterojunction system wherein the electron affinity of the emitter is smaller than that of the base, however, in the case where there is no energy discontinuity of a conduction band end between the base layer and the collector layer, when assuming that the energy discontinuity amount of the conduction band end generated between the emitter layer and the base layer is $\Delta Ec$, a value of $V_{teb}$-$V_{tbc}$ becomes approximately $\Delta Ec$.

Namely, in the above HBT of the first generation, the value of $V_{teb}$-$V_{tbc}$ becomes large.

On the other hand, since the above HBT of the second generation has the configuration wherein the emitter layer and the collector layer become symmetrical about the base layer, the value of $V_{teb}$-$V_{tbc}$ can become close to almost 0, but when an interlayer of a graded energy band profile is provided between the base and collector, the value of $V_{teb}$-$V_{tbc}$ becomes large.

On the other hand, in an HBT of a so-called staggered type heterojunction system wherein the emitter and collector have a larger electron affinity than that of the base, the value of $V_{teb}$-$V_{tbc}$ becomes almost 0, so that it is advantageous for reducing the offset voltage $V_{offset}$.

FIG. 1 is a sectional view of an example of the above staggered type HBT.

In the above semiconductor device, for example, a sub-collector layer 2 made by $n^+$-type InGaAs, a collector layer 3 made by $n^-$-type InP, a base layer 4 made by $p^+$-type GaAsSb, an emitter layer 5 made by n-type InP, and a cap layer 6 made by n-type InGaAs are successively stacked on a substrate 1 made by a semi-insulative single-crystal InP doped with Fe.

An emitter electrode 7 is formed on the cap layer 6. Also, a mesa structure is formed for forming an ohmic contact to a base and a collector, and a part of the base layer 4 contacts a base electrode 8 and a part of the sub-collector layer 2a contacts a collector electrode 9, respectively.

These electrodes are formed, for example, by a stacked body of Ti/Pt/Au.

Also, the surface of the semiconductor not contacting the electrodes is covered with an insulation film 10 made, for example, by $Si_3N_4$.

FIG. 2 is a schematic view of an energy band structure corresponding to the HBT shown in FIG. 1 and shows energy levels of a conductive band C and a valance band V.

The figure shows the energy band profile wherein electron affinities of the emitter and the collector are larger than an electron affinity of the base.

In such an HBT, as explained above, there is an advantage that the value of the offset voltage $V_{offset}$ can be easily made close to 0.

For example, The Japanese Unexamined Patent Publication No. 5-41388 and The Japanese Unexamined Patent Publication No. 6-326120 describe the above HBT of the first generation, and The Japanese Unexamined Patent Publication No. 2002-270616 describes the above staggered type HBT.

Also, the patent articles The Japanese Unexamined Patent Publication No. 6-260493, The Japanese Unexamined Patent Publication No. 8-250509, The Japanese Unexamined Patent Publication No. 11-176838, and The Japanese Unexamined Patent Publication No. 2002-2708174 describe other kinds of HBTs, such as an AlGaAs/GaAs based HBT.

However, in the above staggered type HBT, when an energy discontinuity amount ΔEc of the conduction band end generated between the emitter layer and the base layer is too large, there arises a problem that emitter resistance becomes high and the electron injection efficiency from the emitter layer to the base layer declines.

Also, when the ΔEc is too large, a problem is liable to arise that the breakdown strength between the base layer and the collector layer declines.

Furthermore, there is another disadvantage that, in an HBT having the configuration shown in FIG. 1, a part of the surface of the pn-junction between the emitter and the base exposes in a production process, which leads to an introduction of a defect in some cases, so that reliability declines.

As explained above, a staggered type HBT has the advantages that the value of the offset voltage $V_{offset}$ is easily made to be 0 and the knee voltage can be reduced, while basic characteristics of a transistor are deteriorated, such as an increase of emitter resistance, a decline of breakdown strength between the base layer and the collector layer or a decline of reliability due to a defect introduction, etc. in some cases.

SUMMARY OF THE INVENTION

An object of the present invention is to provide a semiconductor device having a heterojunction bipolar transistor capable of suppressing the deterioration of basic transistor characteristics, such that an injection efficiency from an emitter layer to a base layer declines as a result that emitter resistance becomes high, breakdown strength between the base layer and a collector layer is deteriorated, or reliability declines due to an introduction of a defect, while being capable of reducing an offset voltage $V_{offset}$ and a knee voltage of the heterojunction bipolar transistor.

To attain the above object, there is provided a semiconductor device comprising a heterojunction bipolar transistor having an emitter layer, a base layer and a collector layer, wherein the electron affinity of said base layer is smaller than that of said emitter layer and that of said collector layer, an interlayer is formed at least either between said emitter layer and said base layer or between said base layer and said collector layer, and the electron affinity of said interlayer has a value between the electron affinities of two layers sandwiching said interlayer.

In the above semiconductor device of the present invention, preferably, said interlayer is formed both between said emitter layer and said base layer and between said base layer and said collector layer.

The semiconductor device of the present invention has a staggered type HBT having an energy band profile wherein electron affinities of the emitter and the collector are larger than an electron affinity of the base.

In this HBT, an interlayer having an electron affinity of a value between the electron affinities of the two layers sandwiching the same is formed either between the emitter layer and the base layer or between the base layer and the collector layer, or preferably both between the emitter layer and the base layer and between the base layer and the collector layer.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, embodiments of a semiconductor device of the present invention will be explained with reference to the drawings.

First Embodiment

Figure 3:
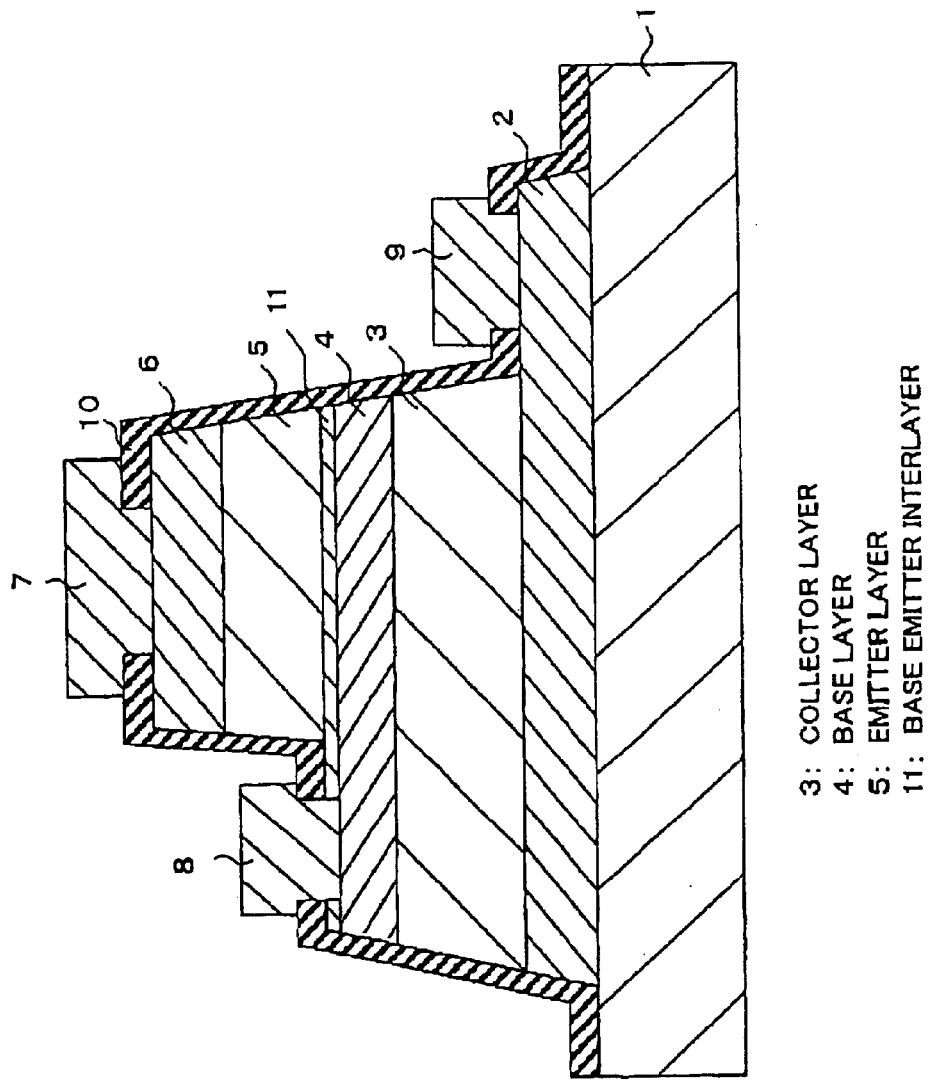
FIG. 3 is a sectional view of a staggered type HBT of a semiconductor device according to a first embodiment.

A semiconductor device according to the present embodiment has a staggered type HBT having an energy band profile in which electron affinities of an emitter and a collector are larger than an electron affinity of a base. FIG. 3 is a sectional view of the above staggered type HBT.

For example, on a substrate 1 made by semi-insulative single-crystal InP doped with Fe, a sub-collector layer 2 made by n$^+$-type InGaAs, a collector layer 3 made by n$^-$-type InP, a base layer 4 made by p$^+$-type GaAsSb, a base emitter interlayer 11 made by n$^+$-type InGaAsSb, an emitter layer 5 made by n-type InP and a cap layer 6 made by n$^+$-type InGaAs are successively stacked.

An emitter electrode 7 is formed on the cap layer 6. A part of the cap layer 6 and the emitter layer 5 is removed and a mesa structure is formed in order to form base contact. The base emitter interlayer 11 near the base electrode 8 may be removed so that the base electrode 8 directly contacts the base layer 4, or a part of the base emitter interlayer 11 may be arranged between the base electrode 8 and the base layer 4.

A mesa structure is formed also for forming a collector electrode 9, and a collector electrode 9 is formed on the sub-collector layer 2.

The emitter electrode 7, the base electrode 8 and the collector electrode 9 are formed by a stacked body of, for example, Ti/Pt/Au.

Also, a surface of the semiconductor surface not contacting an electrode is covered with an insulation film 10 made, for example, by $Si_3N_4$.

Figure 4:
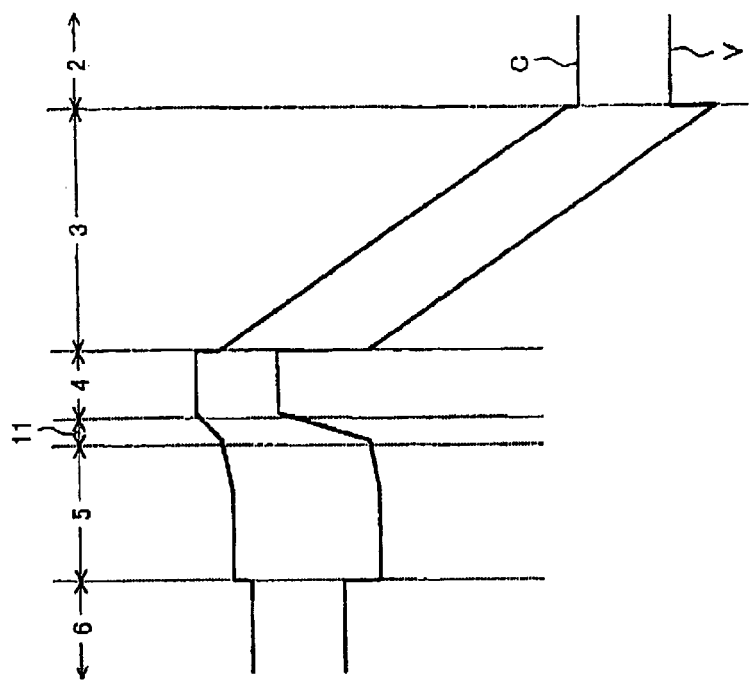
FIG. 4 is a schematic view of an energy band structure corresponding to the HBT shown in FIG. 3.

FIG. 4 is a schematic view of the energy band structure corresponding to the HBT shown in FIG. 3 and shows energy levels of a conductive band C and valence band V.

The figure indicates an energy band profile in which electron affinities of the emitter and the collector are larger than an electron affinity of the base, that is, being a so-called staggered type.

Here, the electron affinity of the base emitter interlayer 11 has a value between the electron affinity of the emitter layer and that of the base layer sandwiching it, that is, it is configured to have a smaller electron affinity than that of the emitter layer and a larger electron affinity than that of the base layer. As a composing material having such an energy profile, for example, InGaAsSb can be used.

Particularly, the base emitter interlayer 11 has a profile in which the electron affinity continuously and gradually decreases from the emitter layer to the base layer; consequently, a profile in which the electron affinity of the emitter layer and that of the base layer sandwiching the base emitter interlayer 11 are smoothly connected is attained.

In this case, for example, it is configured to have a composition gradient in which the composition ratio continuously changes from the emitter layer to the base layer in a composition of InGaAsSb.

Figure 1:
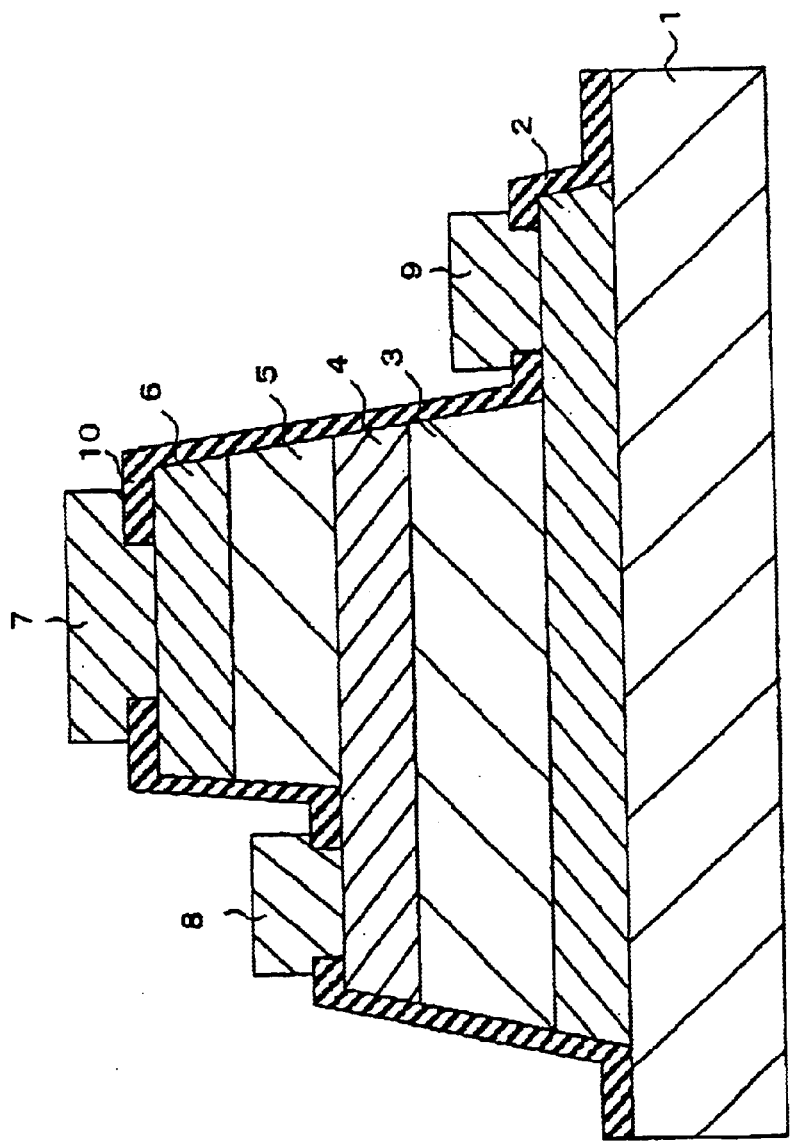
FIG. 1 is a sectional view of a staggered type HBT of a semiconductor device according to the related art.
Figure 2:
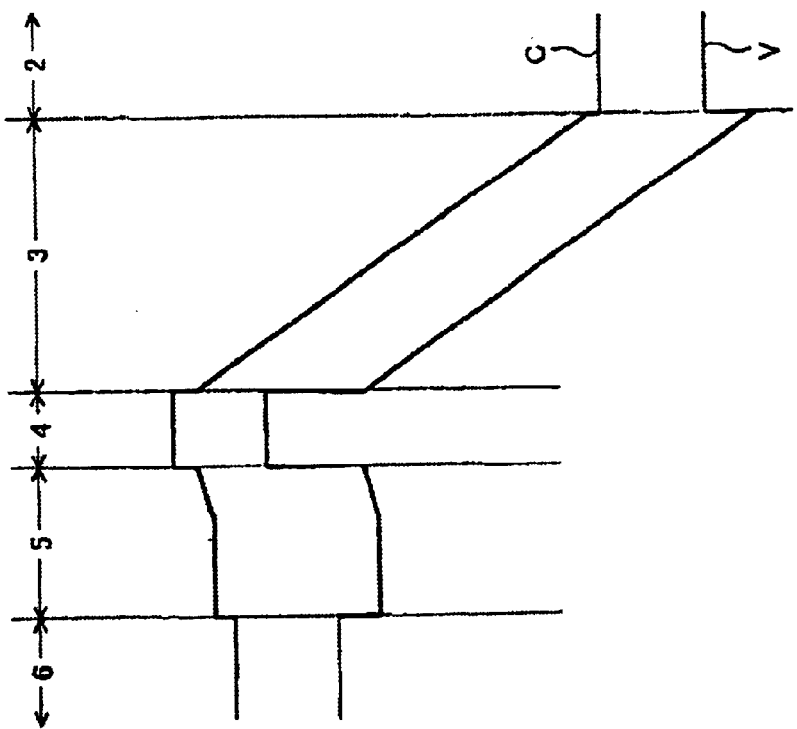
FIG. 2 is a schematic view of an energy band structure corresponding to the HBT shown in FIG. 1.

In the HBT of the present embodiment, a base emitter interlayer 11 comprised of a material wherein an electron affinity continuously and gradually decreases from the emitter layer to the base layer is provided. The reason thereof is that, in the HBT according to the related art shown in FIG. 1, there is a possibility that the injection efficiency from the emitter layer to the base layer declines as a result that emitter resistance becomes high due to the discontinuity of conduction band end energy generated between the base layer 4 and the emitter layer 5. The extent to which it becomes a problem depends on the value of a discontinuity amount $\Delta E_c$ of the conduction band end energy. The larger the $\Delta E_c$, the larger the problem becomes.

Namely, by providing the base emitter interlayer 11 in the HBT of the present embodiment, emitter resistance can be reduced.

Also, the base emitter interlayer 11 may have a profile in which the electron affinity gradually decreases from the emitter layer to the base layer.

In this case, for example, the composition of InGaAsSb has a composition gradient wherein the composition ratio discretely changes as a step shape having a plurality of levels from the emitter layer to the base layer. Namely, it is the configuration having a pseudo composition gradient by stacking a plurality of thin films having a uniform composition ratio and discretely changing the composition ratio of the respective thin films as a step shape having a plurality of levels from the emitter layer to the base layer.

Furthermore, the base emitter interlayer 11 gives a certain effect as a mere single composition layer having a value between the electron affinity of the emitter layer and that of the base layer.

As the base emitter interlayer, for example, InAlGaAs or InGaP, etc. other than the above n$^+$-type InGaAsSb may be used.

Alternately, to attain the profile in which the composition ratio discretely changes as a step shape having a plurality of levels as above, for example, a multilayer film of a InGaAs thin film and a InAlAs thin film or a multilayer film of a InP thin film and a GaAsSb thin film may be used.

Other than the above, for example, a material including Sb may be used as the base layer and a material including P or As may be used as the emitter layer and the collector layer.

For example, by leaving the base layer 4 made by p$^+$-type GaAsSb as it is, a n$^+$-type InGaAs layer may be used as the emitter layer 5 and InP may be used as the base emitter interlayer 11. In this case, since the $\Delta E_c$ between the base layer and the emitter layer is large, the existence of the interlayer becomes all the more important.

As is clear from the above explanation, the HBT of the semiconductor device of the present embodiment reduces emitter resistance and heightens the injection efficiency from the emitter layer to the base layer compared with the HBT of the related art, so that when applied to a power amplifier, a power amplifier having low distortion and high efficiency can be realized.

Furthermore, in the HBT of the semiconductor device of the present embodiment, it is easy to attain the configuration in which the surface of a pn-junction between the emitter and the base does not become exposed in the production process and a decline of reliability due to an introduction of a defect can be prevented.

According to the semiconductor device of the present invention, due to an application of the staggered type, it is possible to suppress the deterioration of basic transistor characteristics, such as a decline of the injection efficiency from the emitter layer to the base layer as a result of the emitter resistance becoming high and a decline of reliability due to an introduction of a defect, etc., while making it possible to decrease the offset voltage $V_{offset}$ and the knee voltage of the heterojunction bipolar transistor.

Second Embodiment

Figure 5:
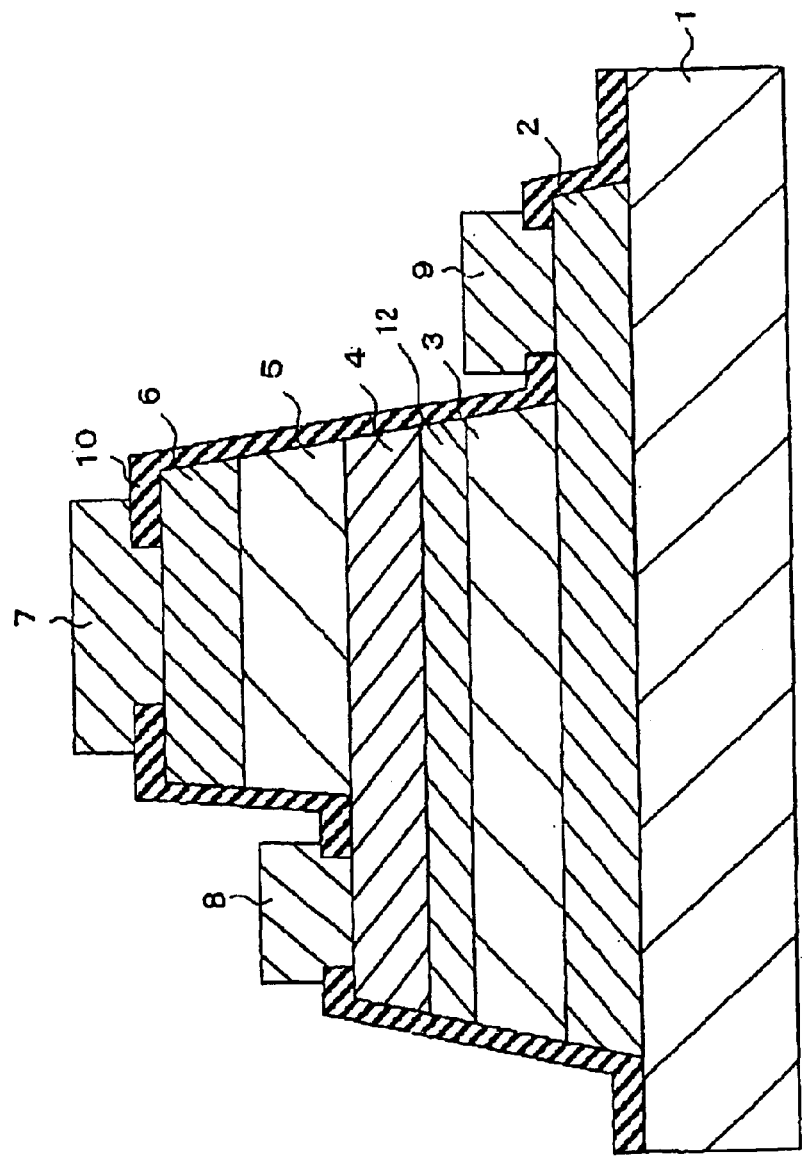
FIG. 5 is a sectional view of a staggered type HBT of a semiconductor device according to a second embodiment.

A semiconductor device according to the present embodiment has a staggered type HBT having an energy band profile in which electron affinities of an emitter and a collector are larger than that of a base in the same way as in the first embodiment. FIG. 5 is a sectional view of the above staggered type HBT.

For example, on a substrate 1 made by semi-insulative, single-crystal InP doped with Fe, a sub-collector layer 2 made by n$^+$-type InGaAs, a collector layer 3 made by n$^-$-type InP, a base collector interlayer 12 made by n$^+$-type InGaAsSb, a base layer 4 made by p$^+$-type GaAsSb, an emitter layer 5 made by n-type InP and a cap layer 6 made by n$^+$-type InGaAs are successively stacked.

An emitter electrode 7 is formed on the cap layer 6. A part of the cap layer 6 and the emitter layer 5 is removed, and a mesa structure is formed in order to form a base contact.

A mesa structure is formed also for forming a collector electrode 9, and the collector electrode 9 is formed on the sub-collector layer 2.

The emitter electrode 7, the base electrode 8 and the collector electrode 9 are formed by a stacked body of, for example, Ti/Pt/Au.

Also, a surface of the semiconductor not contacting an electrode is covered with an insulation film 10 made, for example, by $Si_3N_4$.

Figure 6:
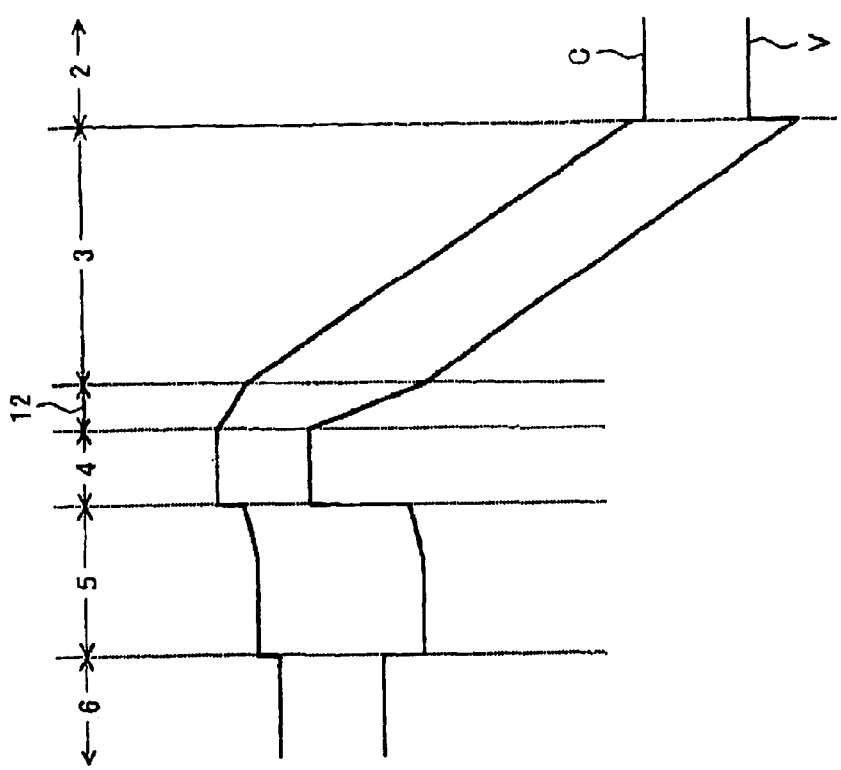
FIG. 6 is a schematic view of an energy band structure corresponding to the HBT shown in FIG. 5.

FIG. 6 is a schematic view of the energy band structure corresponding to the HBT shown in FIG. 5 and shows energy levels of a conductive band C and valence band V.

The figure indicates an energy band profile in which electron affinities of the emitter and the collector are larger than that of the base, that is, being a so-called staggered type.

Here, the electron affinity of the base collector interlayer 12 has a value between the electron affinities of the collector layer and the base layer sandwiching the same, namely, it is configured to have an electron affinity smaller than that of the collector layer and larger than that of the base layer. As a composing material having such an energy profile, for example, InGaAsSb can be used.

Particularly, the base collector interlayer 12 has a profile in which the electron affinity continuously and gradually decreases from the collector layer to the base layer, and consequently, a profile in which the electron affinity of the collector layer and the base layer sandwiching the base collector interlayer 12 are smoothly connected is attained.

In this case, for example, it is configured to have a composition gradient in which the composition ratio continuously changes from the collector layer to the base layer in a composition of InGaAsSb.

In the HBT of the present embodiment, a base collector interlayer 12 composed of a material wherein an electron affinity continuously and gradually decreases from the collector layer to the base layer is provided. The reason thereof is that, in the HBT according to the related art shown in FIG. 1, along with an increase of discontinuity ΔEc of the conduction band end energy generated between the base layer 4 and the emitter layer 5, direct tunneling from the base layer to the collector layer occurs and breakdown strength between the base layer and the collector layer declines.

Namely, by providing the base collector interlayer 12 in the HBT of the present embodiment, a decline of the breakdown strength between the base layer and the collector layer can be suppressed.

Note that the complements to the base emitter interlayer explained in the first embodiment also can be applied as they are to the base collector interlayer.

Namely, the base collector interlayer 12 may have a profile in which the electron affinity gradually decreases from the collector layer to the base layer in the same way as in the base emitter interlayer 11 of the first embodiment.

In this case, for example, the composition of InGaAsSb has a composition gradient wherein the composition ratio discretely changes as a step shape having a plurality of levels from the collector layer to the base layer. Namely, it is the configuration having a pseudo composition gradient by stacking a plurality of thin films having a uniform composition ratio and discretely changing the composition ratio of the respective thin films as a step shape having a plurality of levels from the emitter layer to the base layer.

Furthermore, the base collector interlayer 12 gives a certain effect as a mere single composition layer having a value between the electron affinity of the collector layer and that of the base layer.

As the base collector interlayer, for example, InAlGaAs or InGaP, etc. may be used other than the above n$^+$-type InGaAsSb.

Alternately, to attain the profile in which the composition ratio discretely changes as a step shape having a plurality of levels as above, for example, a multilayer film of a InGaAs thin film and a InAlAs thin film or a multilayer film of a InP thin film and a GaAsSb thin film may be used.

Other than the above, for example, a material including Sb may be used as the base layer and a material including P or As may be used as the emitter layer and the collector layer.

For example, by leaving the base layer 4 made by p$^+$-type GaAsSb as it is, a n$^+$-type InGaAs layer may be used as the collector layer 3 and InP may be used as the base collector interlayer 12. In this case, since the ΔEc between the base layer and the emitter layer is large, the existence of the interlayer becomes all the more important.

As is clear from the above explanation, the HBT of the semiconductor device of the present embodiment can suppress a decline of the breakdown strength between the base layer and the collector layer compared with the HBT of the related art.

According to the semiconductor device of the present embodiment, due to an application of the staggered type, it is possible to suppress the deterioration of basic transistor characteristics, such as a decline of the breakdown strength between the base layer and the collector layer, while attaining a decrease of the offset voltage $V_{offset}$ and the knee voltage of the heterojunction bipolar transistor.

Third Embodiment

Figure 7:
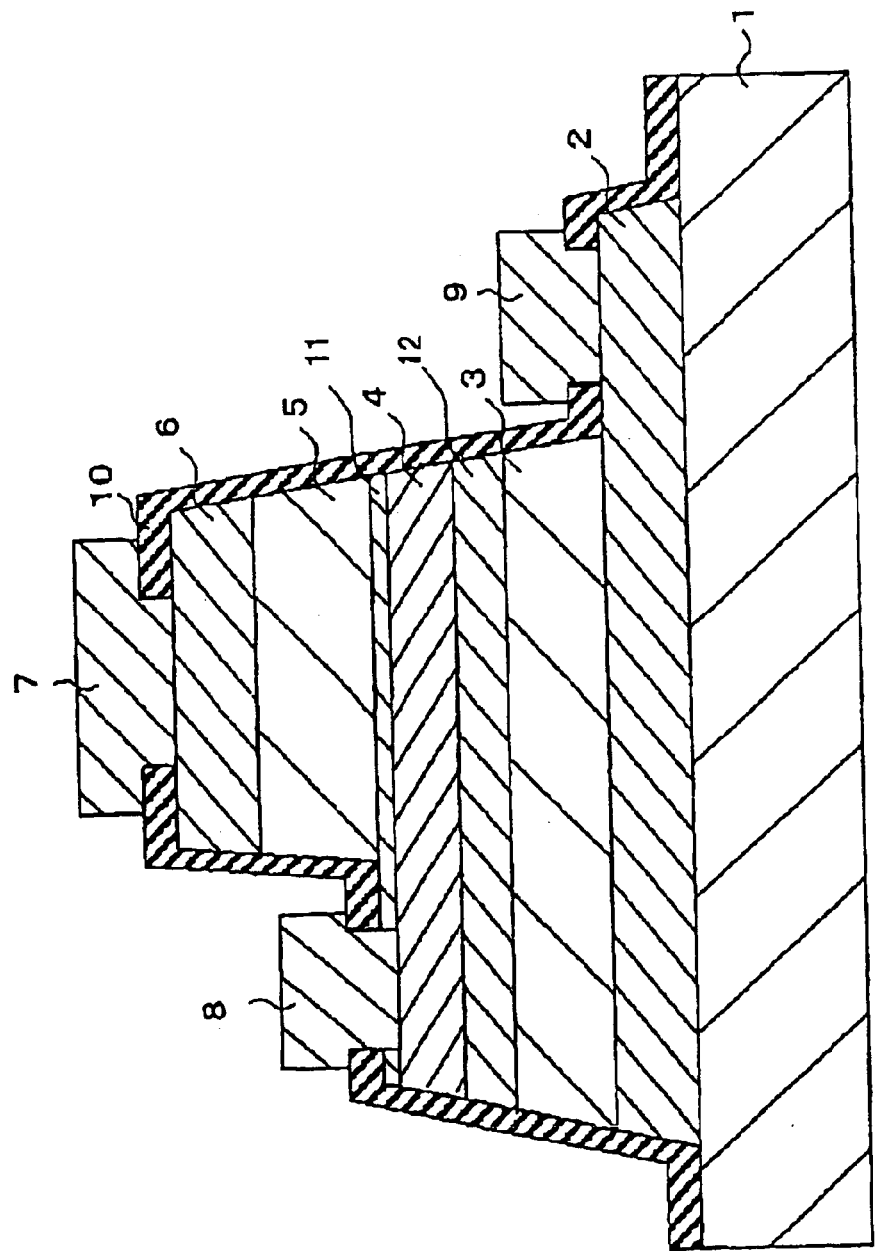
FIG. 7 is a sectional view of a staggered type HBT of a semiconductor device according to a third embodiment.

A semiconductor device according to the present embodiment has a staggered type HBT having an energy band profile in which electron affinities of an emitter and a collector are larger than that of a base in the same way as in the first embodiment and the second embodiment. FIG. 7 is a sectional view of the above staggered type HBT.

For example, on a substrate 1 made by semi-insulative single-crystal InP doped with Fe, a sub-collector layer 2 made by n$^+$-type InGaAs, a collector layer 3 made by n$^+$-type InP, a bass collector interlayer 12 made by n$^+$-type InGaAsSb, a base layer 4 made by p$^+$-type GaAsSb, a base emitter interlayer 11 made by n$^+$-type InGaAsSb, an emitter layer 5 made by n-type InP and a cap layer 6 made by n$^+$-type InGaAs are successively stacked.

An emitter electrode 7 is formed on the cap layer 6. A part of the cap layer 6 and the emitter layer 5 is removed, and a mesa structure is formed in order to form a base contact. The base emitter interlayer 11 near the base electrode 8 may be removed, and the base electrode 8 may directly contact the base layer 4, or a part of the base emitter interlayer 11 may be provided between the base electrode 8 and the base layer 4.

A mesa structure also is formed for forming a collector electrode 9, and a collector electrode 9 is formed on the sub-collector layer 2.

The emitter electrode 7, the base electrode 8 and the collector electrode 9 are formed by a stacked body of, for example, Ti/Pt/Au.

Also, a surface of the semiconductor not contacting an electrode is covered with an insulation film 10 made, for example, by $Si_3N_4$.

Figure 8:
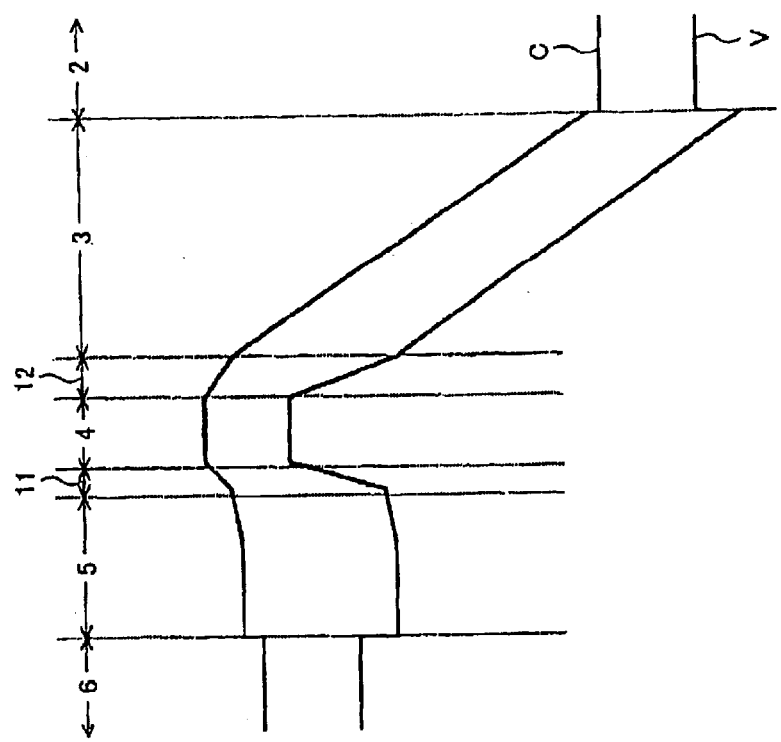
FIG. 8 is a schematic view of an energy band structure corresponding to the HBT shown in FIG. 7.

FIG. 8 is a schematic view of the energy band structure corresponding to the HBT shown in FIG. 7 and shows energy levels of a conductive band C and valence band V.

The figure indicates an energy band profile in which the electron affinities of the emitter and collector are larger than that of the base, that is, being a so-called staggered type.

Here, the electron affinity of the base emitter interlayer 11 and the base collector interlayer 12 have the characteristics explained in the first embodiment and the second embodiment, respectively.

Namely, the base emitter interlayer 11 has a value between the electron affinity of the emitter layer and that of the base layer sandwiching the same, and the base collector interlayer 12 has a value between the electron affinity of the collector layer and that of the base layer sandwiching the same.

The electron affinity of the base emitter interlayer 11 and that of the base collector interlayer 12 may have a gradually and successively changing profile or a profile of discretely changing as a step shape having a plurality of levels, and furthermore, may be a single value between layers sandwiching the same.

The HBT of the semiconductor device of the present embodiment is capable of reducing the emitter resistance compared with an HBT of the related art, thus heightening the injection efficiency from the emitter layer to the base layer and realizing a power amplifier having low distortions and high efficiency when applied to a power amplifier.

Furthermore, the HBT of the semiconductor device of the present embodiment can easily attain the configuration of not exposing the surface of the pn-junction between the emitter and base in the production process, so that it is possible to prevent a decline of reliability due to an introduction of a defect.

Furthermore, it is possible to prevent the deterioration of breakdown strength between the base layer and the collector layer compared with the HBT of the related art.

Also, in the HBT of the semiconductor device of the present embodiment, the rising voltage $V_{teb}$ in the forward direction between the emitter and the base and the rising voltage $V_{tbc}$ in the forward direction between the base and the collector are almost the same, so that the value of $V_{teb}$-$V_{tbc}$ can be made close to almost 0.

According to the semiconductor device of the present embodiment, by applying the staggered type, while making it possible to reduce the offset voltage $V_{offset}$ and the knee voltage of a heterojunction bipolar transistor, it is possible to suppress the deterioration of basic transistor characteristics, such as a decline of the injection efficiency from the emitter layer to the base layer due to rising of emitter resistance, a decline of breakdown strength between the base layer and the collector layer, or a decline of reliability due to the introduction of a defect, etc.

The semiconductor apparatus of the present invention is not limited to the above embodiments. For example, an npn type bipolar transistor was explained in the embodiments, but the present invention can be also applied to the pnp type.

Also, the shape of the mesa structure of the stacked body of the collector layer, the base layer and the emitter layer and the arrangement of electrodes connected to the respective layers, etc. are not limited to the embodiments, and a variety of shapes and arrangements can be applied.

Other than the above, a variety of modifications can be made within the scope of the present invention.

According to the semiconductor device of the present invention, while making it possible to reduce the offset voltage $V_{offset}$ and the knee voltage of a heterojunction bipolar transistor, it is possible to suppress the deterioration of basic transistor characteristics, such as a decline of the injection efficiency from the emitter layer to the base layer due to rising of emitter resistance, a decline of breakdown strength between the base layer and the collector layer, or a decline of reliability due to the introduction of a defect, etc in the semiconductor device having a heterojunction bipolar transistor.

What is claimed is:

1. A semiconductor apparatus comprising a heterojunction bipolar transistor having an emitter layer, a base layer and a collector layer, wherein:
    an electron affinity of said base layer is smaller than that of said emitter layer and that of said collector layer;
    an interlayer is formed at least either between said emitter layer and said base layer or between said base layer and said collector layer; and
    an electron affinity of said interlayer has a value between the electron affinities of the two layers sandwiching said interlayer.

2. A semiconductor apparatus as set forth in claim 1, wherein said interlayer is formed both between said emitter layer and said base layer and between said base layer and said collector layer.

3. A semiconductor apparatus as set forth in claim 1, wherein said electron affinity of said interlayer has a profile of smoothly connecting said electron affinities of the two layers sandwiching said interlayer.

4. A semiconductor apparatus as set forth in claim 1, wherein said electron affinity of said interlayer has a profile of a step shape having a discrete plurality of levels to connect said electron affinities of the two layers sandwiching said interlayer.

* * * * *